XR 3,743,847

United States

Boland

[11] 3,743,847

[45] July 3, 1973

[54] AMORPHOUS SILICON FILM AS A UV FILTER

[75] Inventor: Bernard W. Boland, Scottsdale, Ariz.

[73] Assignee: Motorola, Inc., Franklin Park, Ill.

[22] Filed: June 1, 1971

[21] Appl. No.: 148,799

[52] U.S. Cl. .................. 250/510, 96/36.2, 250/226, 338/18.

[51] Int. Cl. .......................... H01j 39/00, G02b 5/22

[58] Field of Search ................. 350/1, 317; 96/36.2; 250/86, 83.34 U, 83 R, 226; 338/18

[56] References Cited

UNITED STATES PATENTS

| | | | |
|---|---|---|---|
| 3,072,796 | 1/1963 | Eaton | 350/1 X |
| 3,508,982 | 4/1970 | Shearin | 96/36.2 X |
| 3,202,825 | 8/1965 | Brown et al. | 350/1 X |
| 3,537,921 | 11/1970 | Boland | 96/36.2 X |
| 3,510,371 | 5/1970 | Frankson | 96/36.2 |

OTHER PUBLICATIONS

MacChesney et al., "Chemical Vapor Deposition of Iron Oxide Films for Use as Semitransparent Masks," Journal of the Electrochemical Society: S.S. Science, May 1971, 776–81.

*Primary Examiner*—Ronald L. Wibert
*Assistant Examiner*—Ronald J. Stern
*Attorney*—Mueller & Aichele

[57] ABSTRACT

There is disclosed the use of a thin amorphous silicon film as a narrow-band rejection filter which is used either as a mask to UV light in semiconductor device processing or is used as a protective shield for solar cells which overheat in the presence of ultraviolet light.

2 Claims, 5 Drawing Figures

3743847
OR IN 250/510

INVENTOR
Bernard W. Boland
BY *Mueller & Aichele*
ATTY'S.

AMORPHOUS SILICON FILM AS A UV FILTER

BACKGROUND OF THE INVENTION

This invention relates to the use of a thin layer of amorphous silicon as a narrow-band rejection filter in the ultraviolet light range and more particularly to the use of this amorphous silicon layer as a UV opaque mask for semiconductor device processing and as a protective mask for semiconductor devices which overheat in the presence of ultraviolet light.

Amorphous silicon in the applications in which it is normally encountered is opaque to visible light in the thicknesses normally used. It has been found, however, that by reducing the thickness of an amorphous silicon layer to the sub-micron range that the amorphous silicon layer thus formed is a narrow-band filter in the sense that infrared and visible radiation passes through the layer without substantial attentuation while light in the ultraviolet range is blocked and completely attenuated. While a narrow-band rejection filter of this nature has many uses, it is particularly useful in providing a photolithographic mask in semiconductor device processing and as a protective shield on the face of solar cells with the shield preventing the penetration of ultraviolet light while permitting the passage of all other light. Thus, the operation of the solar cell is not degraded by the provision of an amorphous silicon layer.

With respect to the aforementioned masking properties of the amorphous silicon layer, it will be appreciated that silicon monoxide has been utilized as a UV opaque material for masking as shown in the patent to G. D. Franksen, U.S. Pat. No. 3,510,371 issued May 5, 1970. Masking with pure silicon has many advantages over the use of silicon monoxide as a mask as indicated in the Franksen patent. One of these advantages resides in the substantial difference between the optical properties of silicon monoxide and those of amorphous silicon.

There is also a substantial difference between the properties of silicon and transition metal oxides as suggested in the Bell Telephone Laboratory work published in the *Journal of the Electrochemical Society*, May 1971, page 776, by J. B. MacChesney, P.B. O'-Connor, and M. V. Sullivan, entitled "Chemical Vapor Deposition of Iron Oxide Films for Use as Semitransparent Masks". These substantial differences center around the use of an "elemental substance" as opposed to the use of a "compound". It will be appreciated that the physical and chemical properties of compounds do not closely resemble those of any individual "element".

Further, the handling of silicon monoxide (critical HF etching depth control) and iron oxide (control of dangerous carbonyls and explosive reaction products) present substantial processing and control problems which are both expensive and require a high degree of processing sophistication.

Contrasted with the oxide compounds referred to above is an elemental substance, i.e., silicon in its amorphous form. Amorphous silicon is easy to handle, easy to deposit, easy to finely etch, is hard and scratch resistant, and is transparent to IR and visible light in the thicknesses indicated.

In short, it is the utter simplicity of using amorphous silicon as the masking material which makes it so very attractive in a photolithographic process.

There are thus substantial advantages in the use of an amorphous silicon film in substitution for the oxides shown in the Franksen patent and the Bell Telephone Laboratories work. The primary advantage is the thinness of the amorphous silicon film which increases pattern definition by allowing the cutting of fine lines. It will be remembered that it is this thinness which gives the usually opaque amorphous silicon transparency in the visible region of the electromagnetic spectrum. In addition to the narrow-band filter characteristics, the thinness of the amorphous film solves a problem with the masking method shown in the Franksen reference. This problem has to do with the undercutting of the silicon monoxide mask as well as the fogging of the glass on which the mask is supported. It will be appreciated that lateral cutting or widening of the etched lines is proportional to total film thickness. This problem arises in Franksen because of the thickness of the silicon monoxide film which is necessary in order to provide for the UV attenuation properties necessary in masking. In order to pattern the silicon monoxide, a hydrogen fluoride etch is utilized in order to penetrate the thicknesses of silicon monoxide necessary in order to block UV light. This hydrogen fluoride etch, however, not only undercuts those portions of the silicon monoxide which are to remain on the glass substrate, but also results in fogging of the glass unless very thick films are used and the etch is stopped before the etch reaches the monoxide-glass interface. It is therefore significant that amorphous silicon has the aforementioned narrow-band characteristic in layers which are only on the order of 1,000 angstroms thick. Since the appropriate properties can be obtained with the use of thin amorphous silicon layers, many HF-free etches may be utilized which do not attack the glass substrate on which the amorphous silicon is placed, thus reducing both etching time (undercutting) and fogging of the glass.

Evidence that undercutting and fogging exist in the Franksen patent comes from a patent issued to E. B. Shearin, Jr., U.S. Pat. No. 3,508,982 issued Apr. 28, 1970. In this patent Shearin explains that undercutting is alleviated by etching the silicon monoxide layer down to 1.5 to 2.5 microns thereby leaving a thin silicon monoxide layer which is transparent to UV light and which protects the substrate from undercutting. However, controlling etching to this degree of accuracy is difficult in the extreme. The subject film is etched all the way through because the etchant does not attack the glass substrate. It is the 1,000A thickness of the subject film which permits the use of HF-free etchants and which is opaque to UV light.

The subject technique is different from Shearin (1) because it is less complicated in that etching depth need not accurately be controlled to leave a thin layer, (2) because the thin layers herein are opaque to UV while the thin layers in the Shearin patent are transparent to UV, and (3) because it utilizes an elemental substance which is more easily deposited in a uniform manner. It will be appreciated that the depositing of silicon monoxide is at best difficult. In order to provide a uniform layer, a substantial amount, i.e., over 2 microns, is necessary in order to provide for not only the uniformity but also the UV absorportion characteristics.

Referring now to the use of amorphous silicon as a UV protective layer or shield for UV heat sensitive devices such as solar cells, it will be appreciated that in solar cells used in outer space, one of the primary failure modes is heat damage. The heat is internally generated heat which is formed when ultraviolet light strikes the face of the solar cell. It is significant that in these type solar cells the ultraviolet energy is "down-converted" to heat. By providing a thin coating of amorphous silicon on the top of these solar cells, light in the infrared provides the necessary energy to power the solar cells while the ultraviolet energy is prevented from reaching the surface of the solar cell by the thin amorphous film. This amorphous silicon film may also be used to protect other electro-optical devices from UV damage due to direct exposure to sun light. In fact any device which is UV sensitive may be protected by a thin layer of amorphous silicon.

SUMMARY OF THE INVENTION

It is therefore an object of this invention to provide a sub-micron amorphous silicon film for use as a narrow-band rejection filter in the ultraviolet region of the electromagnetic spectrum.

It is a further object of this invention to provide a patterned amorphous silicon mask in which the amorphous silicon thickness is in the sub-micron range such that ultraviolet light does not pass through the mask while light in other areas of the electro-magnetic spectrum passes through the mask, thereby permitting the use of visual cues in the alignment of the mask over a substrate.

It is yet a further object of this invention to provide an amorphous silicon layer on top of a solar cell to prevent overheating of the solar cell due to ultraviolet radiation falling thereon.

Other objects of this invention will be better understood upon reading the following description in connection with the accompanying drawings.

BRIEF DESCRIPTION OF THE INVENTION

Figure 1A:
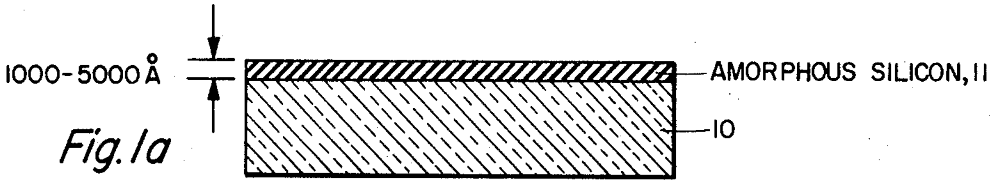
FIGS. 1*a*–1*d* are series of cross-sectional representations of intermediate and final structures resulting in a UV-opaque radiation mask and FIG. 2 is a cross-sectional diagram of a typical solar cell showing a thin amorphous silicon film used as a protective shield for the solar cell, in which the ultraviolet light does not penetrate the film while IR is passed by the film so as to power the solar cell.

There is disclosed the use of a thin amorphous silicon film as a narrow-band filter which is used either as a mask to UV light in semiconductor device processing or is used as a protective shield for solar cells which are damaged by intense ultraviolet light encountered in space.

DETAILED DESCRIPTION OF THE INVENTION

It will be appreciated that the use of a photolithographic mask which is transparent to visible light but opaque to the ultraviolet light has the obvious advantage of being easily aligned over top a semiconductor substrate. The mask may thus be aligned over a substrate by visual inspection. The use of amorphous silicon as a mask for ultraviolet light is particularly attractive in the semiconductor processing art because it is UV light which is generally utilized in exposing photoresist layers on top of which the subject mask is placed.

As mentioned hereinbefore, it is a finding of this invention that amorphous silicon in the sub-micron thickness ranges is opaque to ultraviolet light while acts to transmit light of other frequencies. The amorphous thin film therefore acts as a narrow-band filter which attenuates ultraviolet light while allowing to pass therethrough light in the visible region of the electromagnetic spectrum as well as light in the infrared portion. Thus, the thin amorphous silicon layer in and of itself may be utilized in any optical application in which ultraviolet light is to be attenuated or excluded. As such the thin amorphous silicon layer results in an anti-UV coating for lenses and other optical devices.

Because of recent advances in the state of the art with regard to the deposition of amorphous silicon, it has now become possible to form extremely uniform amorphous silicon films in the 100 to 5,000 A range. The uniformity of the film is important with respect to photolithographic masking. Because of the uniformity of the films now available by gas phase deposition, it is possible to more accurately pattern an amorphous film, because of its uniform nature. Secondly, the amorphous film in the thicknesses described herein requires very little etching time resulting in less undercutting of the mask itself as well as less deterioration of the usual glass substrate on which the thin film mask is deposited. In addition, because amorphous silicon is used, an HF-free etch which does not etch the glass substrate, can be utilized with amorphous films of this thickness to provide excellent pattern definition. This eliminates prior art protection of substrate surfaces or only partial etching which must be accurately controlled.

The term amorphous silicon refers to a form of silicon in which no crystallites occur. There is, however, a form of polycrystalline silicon which approaches the qualities of pure amorphous silicon. In this form of polycrystalline silicon, crystallite structures are smaller than one micron making the polycrystalline film indistinguishable from the amorphous film. It will therefore be appreciated that these polycrystalline silicon films are within the scope of this invention and that when the term amorphous silicon is used, it also encompasses those near-amorphous counterparts of polycrystalline silicon.

Referring now to FIGS. 1*a*–1*d*, an amorphous silicon light mask is shown in various stages of production. In FIG. 1*a*, a glass substrate 10 is provided with an amorphous silicon film 11 in the following manner.

In gas phase deposition, silane is the source of silicon which is decomposed at low temperatures. The rate of deposition is controlled by the silane flow rate. Specifcially, the substrates to be coated are cleaned, degreased and loaded into the reactor. The system is then sealed and purged with an inert gas such as nitrogen or argon to clear the deposition chamber. RF heating is used to heat the carrier and the substrate to between 350°C and 600°C. The carrier gas (nitrogen, argon, helium, or hydrogen, etc.) is flowing during heat up. When the temperature is stabilized, silane is introduced into the carrier gas and adjusted to give a growth rate of 75–100A/min. The run is timed to give a 1,000A total thickness at which time the silane flow is turned off, along with the heat source. The system is finally purged with an inert gas and cooled. It will be appreciated that the aforementioned method of providing amorphous silicon on a glass substrate is only one such method and that other methods such as sputtering and evaporation may be utilized to form amorphous films in the 100 to 5,000 A range. It will be further appreciated that the thickness of the amorphous silicon can be extended to approximately 10,000 angstroms at which point it becomes altogether too opaque to all light except IR and therefore loses its visual transparency and thus its usefulness as a narrow-band filter.

Figure 1B:
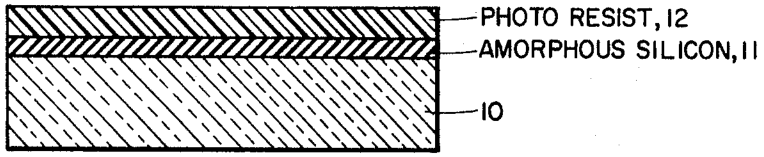
Figure 1C:
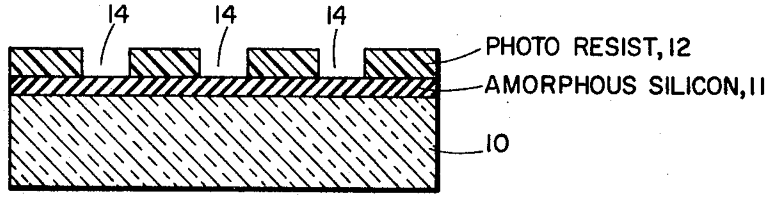
Figure 1D:
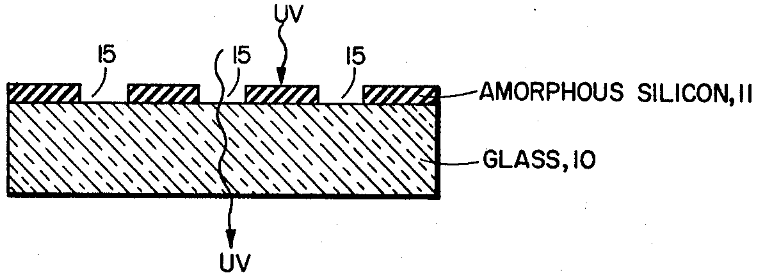

It will be appreciated that although the substrate 10 in this embodiment is glass, other transparent substrates may be utilized in combination with an amorphous film. The requirements for the substrate are that it be transparent to ultraviolet light as well as other light in other portions of the electro-magnetic spectrum and that it not be etched by typical etchants for the amorphous silicon. As shown in FIG. 1*b*, a photoresist 12 is deposited on top of the amorphous silicon layer 11. This photoresist is typically KMER which is a product of Kodak Company. However, any standard commercially available photoresist may also be utilized in masking the amorphous silicon film. As shown in FIG. 1*c*, apertures 14 are provided in the photoresist by conventional photolithographic techniques. Thereafter, the structure comprised of the patterned photoresist film 12, the amorphous film 11 and the substrate 10 are subjected to a commercially available etching solution such as HCl, potassium hydroxide, or sodium hydroxide. The amorphous silicon layer 11 is etched until the surface of the substrate 10 is exposed. It will be appreciated that if the substrate 10 is glass, the etchant does not attack this glass. There is very little undercutting associated with this process because of the thinness of the amorphous silicon layer.

After the aforementioned etching has taken place photoresist mask 12 is removed by conventional means so as to leave the patterned amorphous silicon layer 11 with apertures 15 corresponding in location to the apertures 14 in the original photoresist mask. It will be appreciated that the glass substrate 10 with the patterned amorphous silicon layer 11 can be easily positioned over a substrate because marks on the substrate, reflecting light in the visible portion of the spectrum, can be seen both through the glass and the amorphous silicon film. Thus, mask registration problems which heretofore have resulted in lower yields for semiconductor devices, are eliminated by direct visual observation of the relative position of the mask with respect to the substrate markings.

Figure 2:
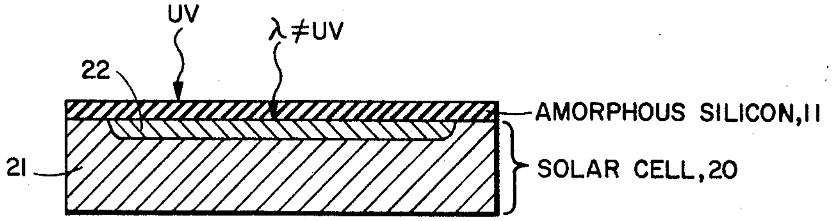

Referring now to FIG. 2, a typical solar cell 20 is shown in diode form with a first conductivity region 21 and a region of opposite conductivity 22 diffused into the first region. On top of this solar cell configuration, is deposited amorphous silicon film 25. Since the amorphous silicon film operates to attenuate ultraviolet light, IR light penetrates the amorphous film to power the solar cell. The ultraviolet light is reflected such that it does not reach the solar cell 20 and cannot therefore cause the aforementioned detrimental heating. The drawing comprising FIG. 2 is obviously a diagrammatic representation of a large variety of solar cells. In general, it is possible to take any completed solar cell (that is a solar cell having contact metallization thereon) and coat the top surface with amorphus silicon. The reason that this is possible is because amorphous silicon is deposited at low temperatures. The solar cells which benefit most from the subject amorphous silicon layer are those intended for outer space use.

It will be appreciated, however, that other light sensitive devices such as photodetectors, photoresistors and phototransistors can benefit from the use of a coating of the aforementioned amorphous silicon so as to extend their lifetimes in high ultraviolet environments such as those that occur in deep space.

In summary, there is provided a thin amorphous silicon film which operates as a selective filter for ultraviolet light. As such, it can be utilized in any optical application in which ultraviolet light is to be attenuated. Included in these applications are both the aforementioned masking and the aforementioned protection of photoconductive semiconductor devices. The utter simplicity of using elemental silicon in this manner eliminates careful control of etching steps, eliminates sophisticated processing to avoid toxic and explosive intermediates and provides an exceptionally low cost durable product.

What is claimed is:

1. An ultraviolet filter comprising a substrate and a deposited layer of amorphous silicon on one surface of said substrate, said amorphous silicon being a silicon free of crystallites larger than one micron, said layer having a thickness of less than 10,000 A whereby light in the ultraviolet region of the spectrum is blocked by said silicon layer while light in the other regions of the electromagnetic spectrum passes therethrough unattenuated.

2. The filter as recited in claim 1 wherein said substrate is a solar cell having its active surface adjacent said silicon layer whereby infrared radiation passes through the filter to power the cell while degrading ultraviolet radiation is blocked.

* * * * *